United States Patent [19]

Baldwin et al.

[11] 4,216,460
[45] Aug. 5, 1980

[54] TRANSMISSION AND/OR RECORDING OF DIGITAL SIGNALS

[75] Inventors: John L. E. Baldwin, Croydon; Robert A. Bellis, Colden Common; John G. S. Ive, Winchester, all of England

[73] Assignee: Independent Broadcasting Authority, London, England

[21] Appl. No.: 923,972

[22] Filed: Jul. 12, 1978

[30] Foreign Application Priority Data

Jul. 14, 1977 [GB] United Kingdom .............. 29692/77

[51] Int. Cl.$^2$ .............................................. G06F 11/00
[52] U.S. Cl. ................................. 371/57; 340/347 DD
[58] Field of Search ........... 340/146.1 AG, 146.1 AB, 340/146.1 R, 347 DD

[56] References Cited

U.S. PATENT DOCUMENTS

| 2,709,199 | 5/1955 | Van Duuren | 340/146.1 AB |
| 3,439,327 | 4/1969 | Sourgens | 340/146.1 AB |
| 3,678,389 | 7/1972 | Heers et al. | 340/347 DD |
| 3,706,880 | 12/1972 | Spani | 340/347 DD |
| 3,810,111 | 5/1974 | Patel | 340/347 DD |
| 4,003,041 | 1/1977 | Van Duuren | 340/347 DD |
| 4,020,282 | 4/1977 | Halpern | 340/347 DD |

Primary Examiner—Charles E. Atkinson
Attorney, Agent, or Firm—Lawrence E. Laubscher

[57] ABSTRACT

A digital processing system is disclosed, including an analog to digital converter for converting an analog signal into digital signals in the form of words each made up of a plurality of binary digits, and an encoding device for transforming the digital signals into digital words each having a predetermined number of identical binary digits.

14 Claims, 7 Drawing Figures

| Input | Output MSB LSB | Input | Output MSB LSB | Input | Output MSB LSB |
|---|---|---|---|---|---|
| 0 | 0000011111 | 45 | 0011001110 | 90 | 0101001110 |
| 1 | 0000011111 | 46 | 0011100110 | 91 | 0101100110 |
| 2 | 1000011111 | 47 | 0100011101 | 92 | 0110100110 |
| 3 | 0000111110 | 48 | 0100010111 | 93 | 0110110010 |
| 4 | 0001111100 | 49 | 0100011011 | 94 | 0111010010 |
| 5 | 0011111000 | 50 | 0110001011 | 95 | 0100111010 |
| 6 | 0111110000 | 51 | 0110001101 | 96 | 0100101110 |
| 7 | 0111100001 | 52 | 0111000101 | 97 | 0100110110 |
| 8 | 0111000011 | 53 | 0101110001 | 98 | 0110010110 |
| 9 | 0110000111 | 54 | 0101000111 | 99 | 0110011010 |
| 10 | 0100001111 | 55 | 0101100011 | 100 | 0111001010 |
| 11 | 0000101111 | 56 | 0110100011 | 101 | 0010111010 |
| 12 | 0000110111 | 57 | 0110110001 | 102 | 0010101110 |
| 13 | 0000111011 | 58 | 0111010001 | 103 | 0010110110 |
| 14 | 0000111101 | 59 | 0100111001 | 104 | 0011010110 |
| 15 | 0011110001 | 60 | 0100100111 | 105 | 0011011010 |
| 16 | 0011100011 | 61 | 0100110011 | 106 | 0011101010 |
| 17 | 0011000111 | 62 | 0110010011 | 107 | 0101010011 |
| 18 | 0010001111 | 63 | 0110011001 | 108 | 0101011001 |
| 19 | 0001001111 | 64 | 0111001001 | 109 | 0101101001 |
| 20 | 0001100111 | 65 | 0010111001 | 110 | 0110101001 |
| 21 | 0001110011 | 66 | 0010100111 | 111 | 0101001011 |
| 22 | 0001111001 | 67 | 0010110011 | 112 | 0101001101 |
| 23 | 0001111010 | 68 | 0011010011 | 113 | 0101100101 |
| 24 | 0001110110 | 69 | 0011011001 | 114 | 0110100101 |
| 25 | 0001101110 | 70 | 0011101001 | 115 | 0100101011 |
| 26 | 0001011110 | 71 | 0010011101 | 116 | 0100101101 |
| 27 | 0011110010 | 72 | 0010010111 | 117 | 0100110101 |
| 28 | 0010011110 | 73 | 0010011011 | 118 | 0110010101 |
| 29 | 0011110100 | 74 | 0011001011 | 119 | 0010101011 |
| 30 | 0011101100 | 75 | 0011001101 | 120 | 0010101101 |
| 31 | 0011011100 | 76 | 0011100101 | 121 | 0010110101 |
| 32 | 0010111100 | 77 | 0001011101 | 122 | 0011010101 |
| 33 | 0111100100 | 78 | 0001010111 | 123 | 0101010110 |
| 34 | 0100111100 | 79 | 0001011011 | 124 | 0101011010 |
| 35 | 0111101000 | 80 | 0001101011 | 125 | 0101101010 |
| 36 | 0111011000 | 81 | 0001101101 | 126 | 0110101010 |
| 37 | 0110111000 | 82 | 0001110101 | 127 | 0101010101 |
| 38 | 0101111000 | 83 | 0101110100 | 128 | 1010101010 |
| 39 | 0111100010 | 84 | 0101011100 | 129 | 1001010101 |
| 40 | 0100011110 | 85 | 0101101100 | 130 | 1010010101 |
| 41 | 0110011100 | 86 | 0110101100 | 131 | 1010100101 |
| 42 | 0111001100 | 87 | 0110110100 | 132 | 1010101001 |
| 43 | 0110001110 | 88 | 0111010100 | 133 | 1100101010 |
| 44 | 0111000110 | 89 | 0101110010 | 134 | 1101001010 |

FIG. 3a.

| Input | Output MSB LSB | Input | Output MSB LSB | Input | Output MSB LSB |
|---|---|---|---|---|---|
| 135 | 1101010010 | 180 | 1100110010 | 225 | 1100010011 |
| 136 | 1101010100 | 181 | 1100110100 | 226 | 1100001011 |
| 137 | 1001101010 | 182 | 1101100100 | 227 | 1101100001 |
| 138 | 1011001010 | 183 | 1101101000 | 228 | 1100001101 |
| 139 | 1011010010 | 184 | 1101100010 | 229 | 1110100001 |
| 140 | 1011010100 | 185 | 1100010110 | 230 | 1110010001 |
| 141 | 1001011010 | 186 | 1100100110 | 231 | 1110001001 |
| 142 | 1010011010 | 187 | 1100101100 | 232 | 1110000101 |
| 143 | 1010110010 | 188 | 1101001100 | 233 | 1110000110 |
| 144 | 1010110100 | 189 | 1101011000 | 234 | 1110001100 |
| 145 | 1001010110 | 190 | 1101000110 | 235 | 1110011000 |
| 146 | 1010010110 | 191 | 1000110110 | 236 | 1110110000 |
| 147 | 1010100110 | 192 | 1001100110 | 237 | 1101110000 |
| 148 | 1010101100 | 193 | 1001101100 | 238 | 1100111000 |
| 149 | 1100010101 | 194 | 1011001100 | 239 | 1100011100 |
| 150 | 1100100101 | 195 | 1011011000 | 240 | 1100001110 |
| 151 | 1100101001 | 196 | 1011000110 | 241 | 1111000010 |
| 152 | 1101001001 | 197 | 1000101110 | 242 | 1111000100 |
| 153 | 1101010001 | 198 | 1001001110 | 243 | 1111001000 |
| 154 | 1101000101 | 199 | 1001011100 | 244 | 1111010000 |
| 155 | 1000110101 | 200 | 1010011100 | 245 | 1011110000 |
| 156 | 1001100101 | 201 | 1010111000 | 246 | 1001111000 |
| 157 | 1001101001 | 202 | 1010001110 | 247 | 1000111100 |
| 158 | 1011001001 | 203 | 1000111010 | 248 | 1000011110 |
| 159 | 1011010001 | 204 | 1001110010 | 249 | 1000001111 |
| 160 | 1011000101 | 205 | 1001110100 | 250 | 1100000111 |
| 161 | 1000101101 | 206 | 1011100100 | 251 | 1110000011 |
| 162 | 1001001101 | 207 | 1011101000 | 252 | 1111000001 |
| 163 | 1001011001 | 208 | 1011100010 | 253 | 1111100000 |
| 164 | 1010011001 | 209 | 1100011001 | 254 | 1111100000 |
| 165 | 1010110001 | 210 | 1100110001 | 255 | 1111100000 |
| 166 | 1010001101 | 211 | 1000111001 | | |
| 167 | 1000101011 | 212 | 1001110001 | | |
| 168 | 1001001011 | 213 | 1000110011 | | |
| 169 | 1001010011 | 214 | 1001100011 | | |
| 170 | 1010010011 | 215 | 1011100001 | | |
| 171 | 1010100011 | 216 | 1000011101 | | |
| 172 | 1010001011 | 217 | 1010000111 | | |
| 173 | 1110001010 | 218 | 1001000111 | | |
| 174 | 1110010010 | 219 | 1000100111 | | |
| 175 | 1110010100 | 220 | 1000010111 | | |
| 176 | 1110100100 | 221 | 1011000011 | | |
| 177 | 1110101000 | 222 | 1000011011 | | |
| 178 | 1110100010 | 223 | 1101000011 | | |
| 179 | 1100011010 | 224 | 1100100011 | | |

FIG. 3b.

PARALLEL TO SERIAL CODE CONVERTER

| Input | Number<br>MSB | Redistribute<br>Input Number<br>Range<br>MSB | Code<br>Convert<br>MSB | Generate<br>Parity<br>MSB ←PARITY→ | Expand Coded<br>Range<br>MSB ←PARITY→ |
|---|---|---|---|---|---|
| 255 | 11111111 | 11111111 | 11110000 | 11111000000 | 11111000000 |
| 253 | 11111101 | 11111101 | 11110000 | 11111000000 | 11111000000 |
| --- | --- | --- | --- | --- | --- |
| 159 | 10011111 | 10011111 | 10110100 | 101010001 | 101010001 |
| 128 | 10000000 | 10000000 | 10101010 1 | 10101010101 0 | 10101010101 0 |
| 127 | 01111111 | 00000000 | 00101010 1 | 00101010101 0 | 01010101010 1 |
| --- | --- | --- | --- | --- | --- |
| 96 | 01100000 | 00011111 | 00101000 | 001010001 | 010010110 |
| 2 | 00000010 | 01111101 | 01110000 | 011111000000 | 00000111111 |
| 0 | 00000000 | 01111111 | 01110000 | 011111000000 | 00000111111 |

FIG. 4a.

SERIAL TO PARALLEL CODE CONVERTER

| Expand Coded Range | Compress Coded Range | Code Convert | Redistribute Output Number Range | Output Number |
|---|---|---|---|---|
| M S B | M S B | M S B | M S B | |
| 111100000 | 11110000X | 11111101 | 11111101 | 253 |
| 111100000 | 11110000X | 11111101 | 11111101 | 233 |
| --- | --- | --- | --- | --- |
| 101010001 | 10110100X | 10011111 | 10011111 | 159 |
| 101010010 | 10101010X | 10000000 | 10000000 | 128 |
| 010101010101 | 00101010X | 00000000 | 01111111 | 127 |
| --- | --- | --- | --- | --- |
| 010010110 | 00110100X | 00011111 | 01100000 | 96 |
| 000001111 | 01110000X | 01111111 | 00000010 | 2 |
| 000001111 | 01111000X | 01111111 | 00000010 | 2 |
| | X=Discard | | | |

TRANSMISSION AND/OR RECORDING OF DIGITAL SIGNALS

BRIEF DESCRIPTION OF THE PRIOR ART

The present invention relates to digital processing apparatus and more particularly to the transmission and/or recording of digital signals.

The preferred embodiment of the invention will be described in relation to its use for video signals but it will be appreciated that the apparatus is of general use, for example for sound. When a video signal is converted to digital form the technique used herein is to sample the signal at equal time intervals and to convert each sample produced into a binary number, which will be assumed to have eight digits, the binary integer 'n' chosen can be considered to be that which makes a voltage nq most closely correspond to the sample; q, a quantum, is the difference between one representable level and the next.

An eight digit binary number can represent the decimal numbers 0 to 255, 0 corresponding to 0000 0000 and 255 to 1111 1111. If a zero corresponds to zero volts and a '1' corresponds to one volt then for a Non-Return to zero (NRZ) code the DC component of the digital signal can vary from 0 to 1 volt.

A problem can arise if repetition of numbers such as 0000 0000 occurs. In this case there would be no transitions and circuits relying on recovered clock signals could get out of step.

One method that has been proposed is based on the significant correlation between closely spaced points of a picture defined by samples. Normally this would mean that two adjacent digital words would be numerically close to one another but this does not ensure a sufficient number of transitions. To illustrate this point consider the two words representing 127 and 128; in normal binary from these are represented as 0111 1111 and 1000 0000. Each word contains only one transition.

This problem may be decreased by converting the words to a suitable code and remaining in this code until the critical parts of the equipment have been passed and our co-pending application U.S. Ser. No. 864,006 filed Dec. 23, 1977 discloses one code which may be used.

Often parity is used for error detection and concealment. This may be 'odd' parity of an odd number of bits performed by modulo 2 adding say 3 or 5 bits together and if the sum is 0 the parity is '1' and vice versa. This type of parity is disclosed in our copending application U.S. Ser. No. 864,006 filed Dec. 23, 1977. When such a parity bit is inserted in each word this increases the minimum number of transitions.

SUMMARY OF THE INVENTION

The present invention provides digital processing apparatus comprising analogue to digital converting means for converting an analogue signal into digital signals in the form of words each made up of a plurality of binary digits, and encoding means connected to the converting means for encoding the digital signals by transforming the digital signals into digital words each having a predetermined number of identical binary digits.

BRIEF DESCRIPTION OF THE DRAWING

Features and advantages of the present invention will become apparent from the following description of an embodiment thereof when taken in conjunction with the accompanying drawing, in which.

DETAILED DESCRIPTION

In the preferred embodiment of the present invention which will now be described, low frequency and d.c. signals are effectively removed by use of a suitable code which is based on a principle that there will be a predetermined number of identical symbols which number will be the same for all or substantially all the words of the code.

As in the aforementioned co-pending application, the input signal is sampled and each sample assigned to one of 256 digital levels, each of which is represented by an 8-bit digital word. The eight bit word is then converted using a specially chosen code. In the present embodiment, the code has been chosen so that the levels which are more likely to be assigned to samples of the input signal are assigned code words with the more transitions.

For television signals, the more likely levels to be obtained are in the middle of the range of levels and the less likely levels are those at the extremities of the range. In order to provide a suitable number of code words it has been found necessary to use a code word which contains more 'bits' than the digital word assigned to a level. Thus, when using an 8-bit digital word for 256 levels it has been found necessary to use 10 bit code words. This provides 252 code words, each of which contains 5 'ones' and 5 'zeros'. By limiting the number of 'ones' which can appear in any code word each word can be checked for errors.

In more detail, and referring to the drawings, an input analogue signal is sampled at a frequency which is a multiple of the video subcarrier frequency (fsc) e.g. 2, 3 or 4 times fsc, and each sample assigned to one of 256 levels and an 8-bit binary digital number generated indicative of the level assigned. The 8-bit word is then transformed into a 10-bit code word using the apparatus shown in FIG. 1. It will be seen that in addition to producing a 10-bit code word, the apparatus in FIG. 1 also performs a parallel to series conversion.

Figure 3A:
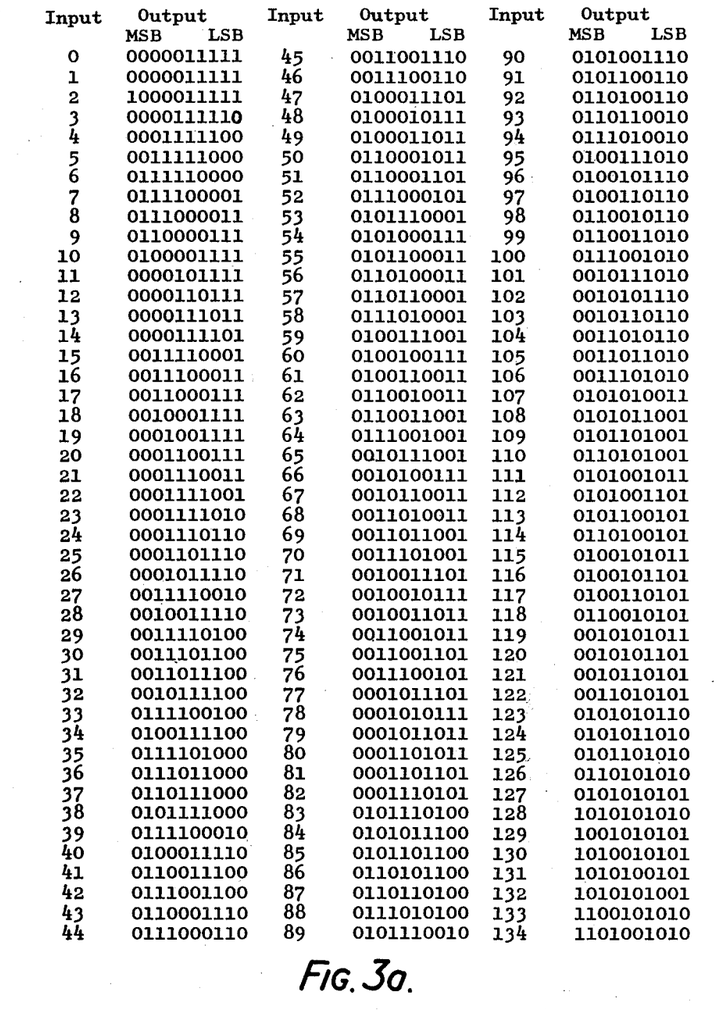
FIG. 3 shows the preferred code.
Figure 3B:
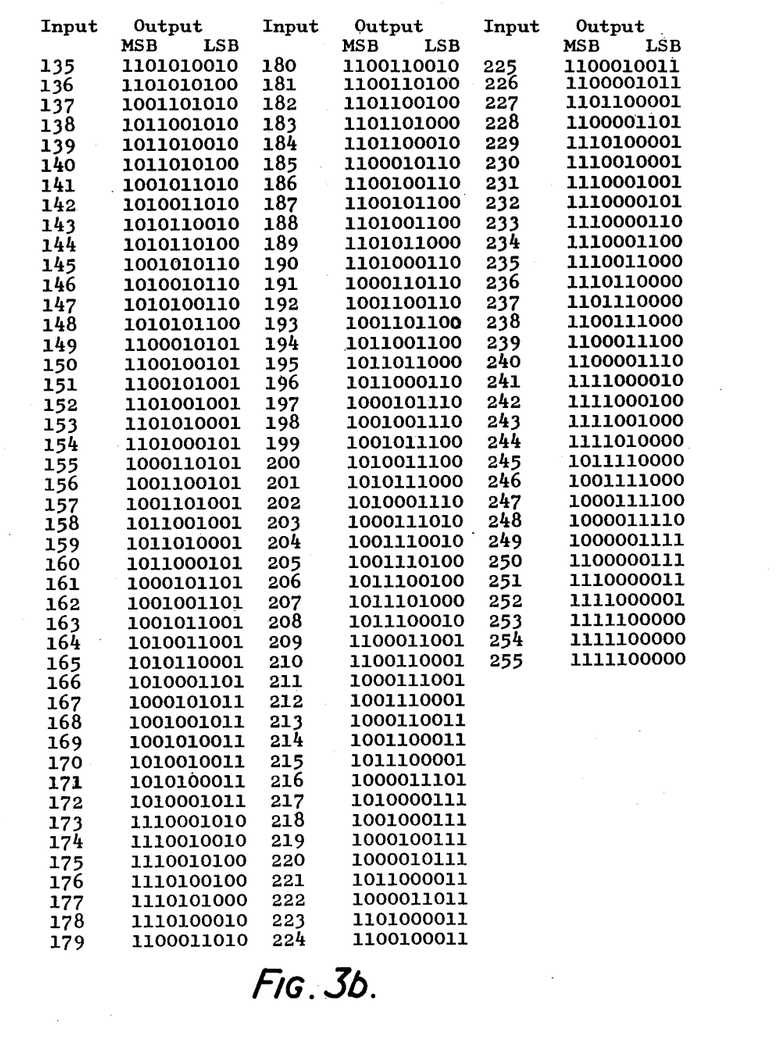

The code used is shown in detail in FIG. 3 and the bulk of it is stored in a store comprising two 8-bit programmable read only memories 10 and 11. A feature of the code shown in FIG. 3 is that the first 128 numbers (0-127) are the mirror image of the second 128 numbers, i.e. 127 is the mirror image, or complement of 128 and so on until 0 is the mirror image of 255. This means that a simplification of the apparatus can be achieved. A further feature of the code is that there are, by definition, 5 zeros and 5 ones in each word; therefore by knowing nine of the bits of a ten bit word one can determine the tenth bit. One advantage of both these features of the code, is that although 10 bit code words are used, only 8-bit read only memories are used.

Figure 4A:
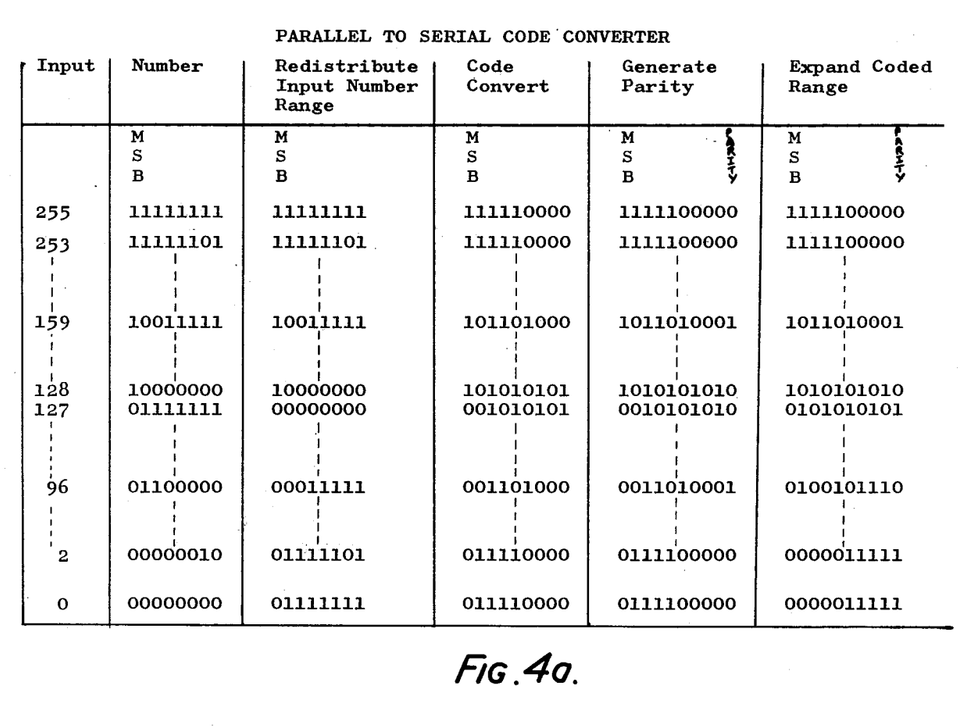
FIG. 4 shows diagrammatically the operation of the apparatus shown in FIGS. 1 and 2.
Figure 4B:
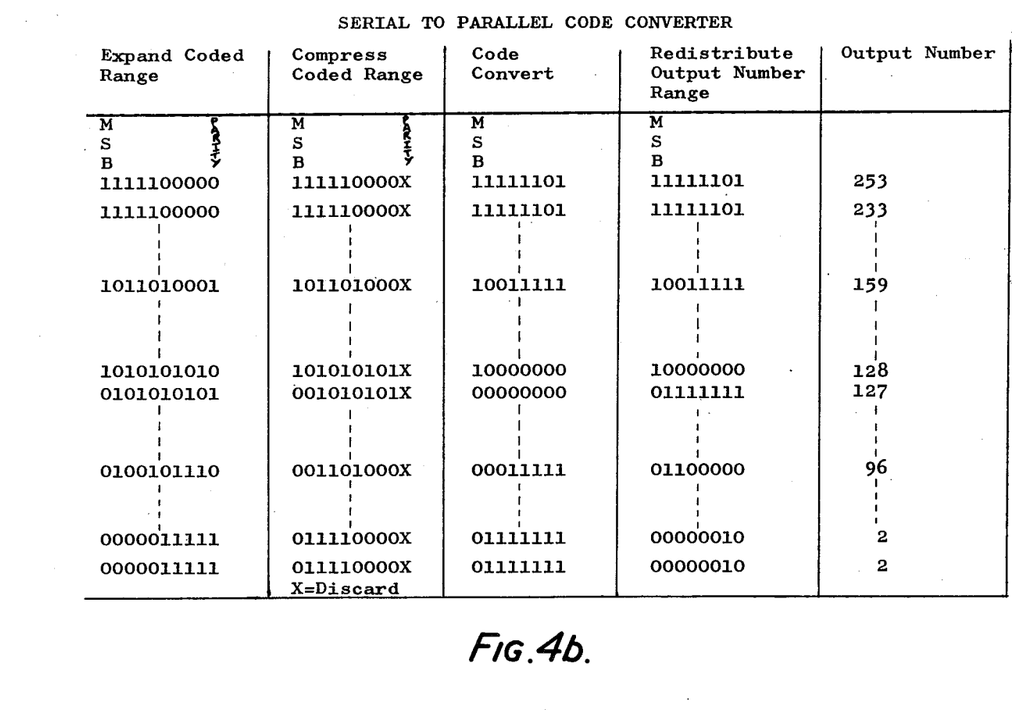

Of the 8-bit word generated by the sampling, the most significant bit is fed to an inverter 12 and the remainder of the word to gating means in the form of seven parallel exclusive-OR gates 13. The most significant bit is used to determine whether the 8-bit word lies in the range 0 to 127 or 128 or 255. If it is a 'one', the 8-bit word lies in the range 128 to 255 and if it is a zero, the 8-bit word lies in the range 0 to 127. If the most significant bit is a 'one' the inverter 12 which feeds one input of each of the exclusive-OR gates 13 produces a 'zero' at its output and so the remaining 7 bits of the 8-bit word are unaltered. However, if the most significant bit is a 'zero' the remaining 7 bits are complemented. The effect of this is shown clearly in the first two columns of FIG. 4. Using this technique, the memories 10 and 11 need only code words for one half the total number of levels being used. Thus the 7 bit input signals to the memories are sufficient and generate an 8-bit output to which is added the most significant bit. The resultant 9-bit word is shown in the third column in FIG. 4.

The most significant bit of the 9-bit word is fed to a further inverter 15 and the rest of the word to eight exclusive-OR gates 16. In addition, the rest of the 9-bit word is fed to a parity generator circuit 18 which detects whether there is an odd or even number of 'ones' in the rest of the word and if there is an even number it generates a 'one', otherwise a 'zero' is produced. The output from the parity generator circuit is fed to one input of a further exclusive-OR gate 20 whose other input receives the inverted most significant bit. Thus, if the most significant bit is a 'one' the parity generator circuit alone will determine whether the tenth bit of the code word is a 'one' or a 'zero' whereas if the most significant bit is a 'zero' the exclusive-OR gate 20 will invert the output from the parity generator circuit to determine the tenth bit of the code word. The resultant 10-bit code word is thus composed of the most significant bit of the original binary word, an 8-bit word stored in the memories 10 and 11 and finally a parity bit or its complement which depends on the number of 'ones' which are already present in the word. This is then converted in a parallel to series converter 17 and may be transmitted or recorded.

Figure 1:
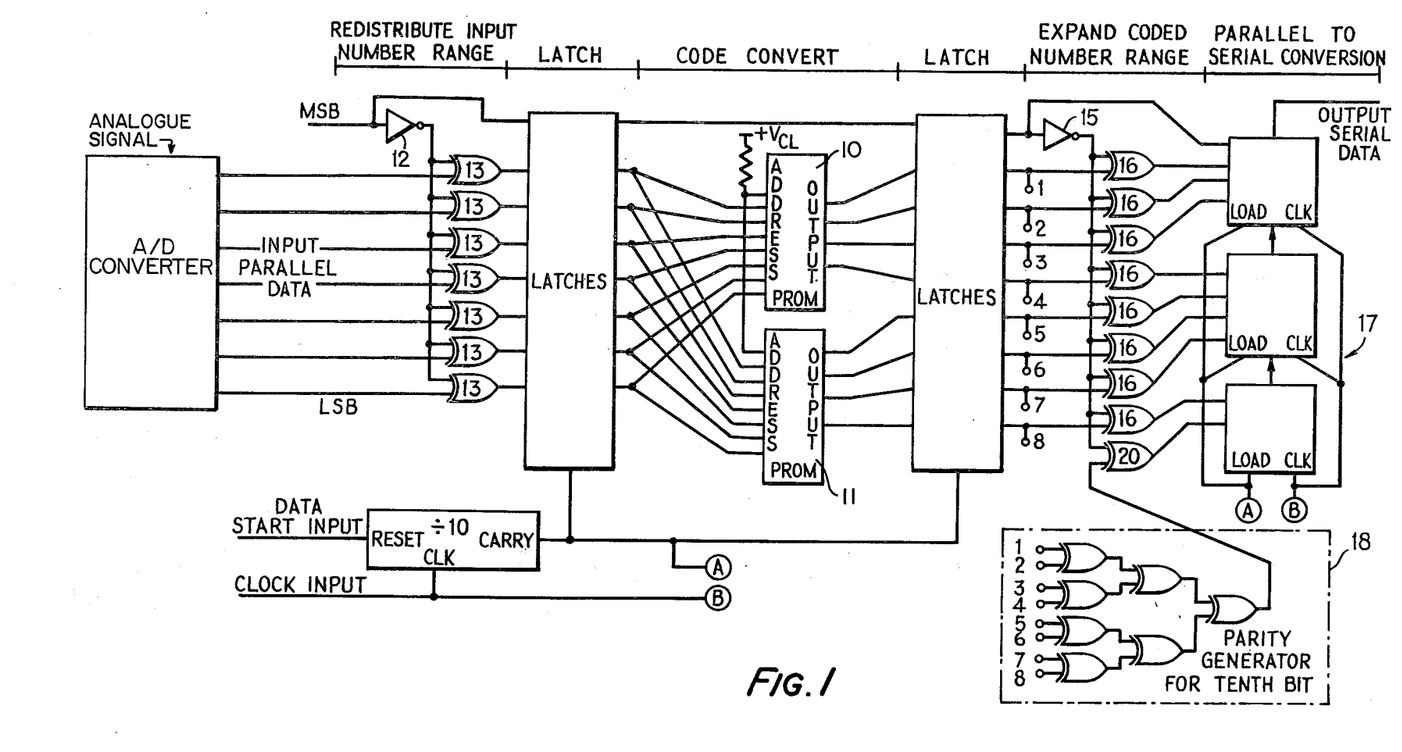
FIG. 1 shows a block diagram of apparatus for producing coded digital signals.
Figure 2:
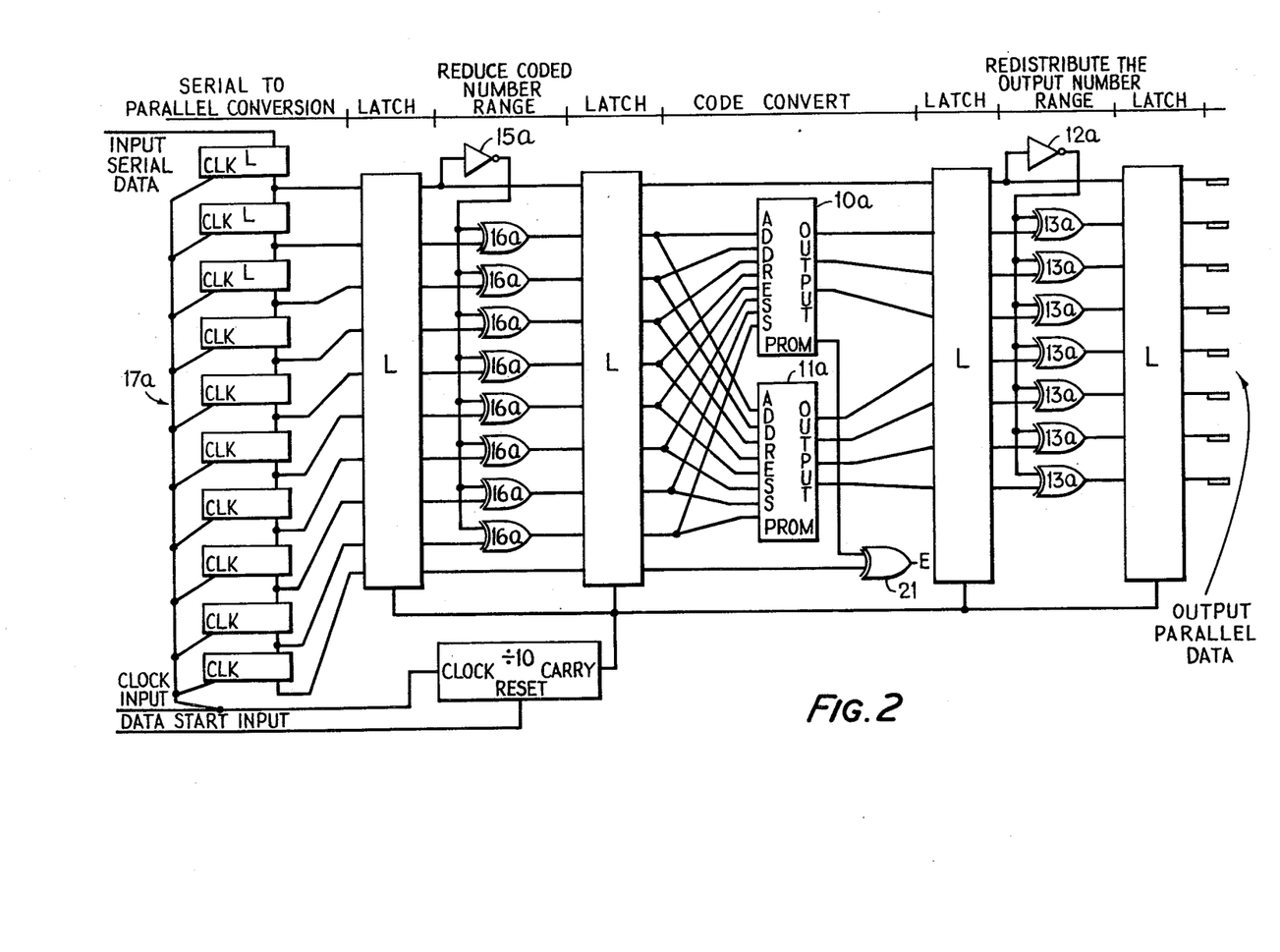
FIG. 2 shows a block diagram of apparatus for decoding digital signals.

FIG. 2 shows apparatus for receiving or playing back the digital signal and operates in the reverse way to the encoder shown in FIG. 1. It is believed that the operation of FIG. 2 will be clear given the previous description of FIG. 1 and the explanation shown in FIG. 4. The parts of FIG. 2 which operate in the same or directly opposite manner to FIG. 1 are indicated by the subscript a.

One method of error detection is shown in FIG. 2 and comprises an exclusive-OR gate 21 which receives as inputs a signal from one of the memories and the least significant bit of the input word. If these are identical no output is generated, if not, i.e. if there is an error, an output is generated. This is one method of error detection. Another method will be described in relation to FIG. 5.

Figure 5:
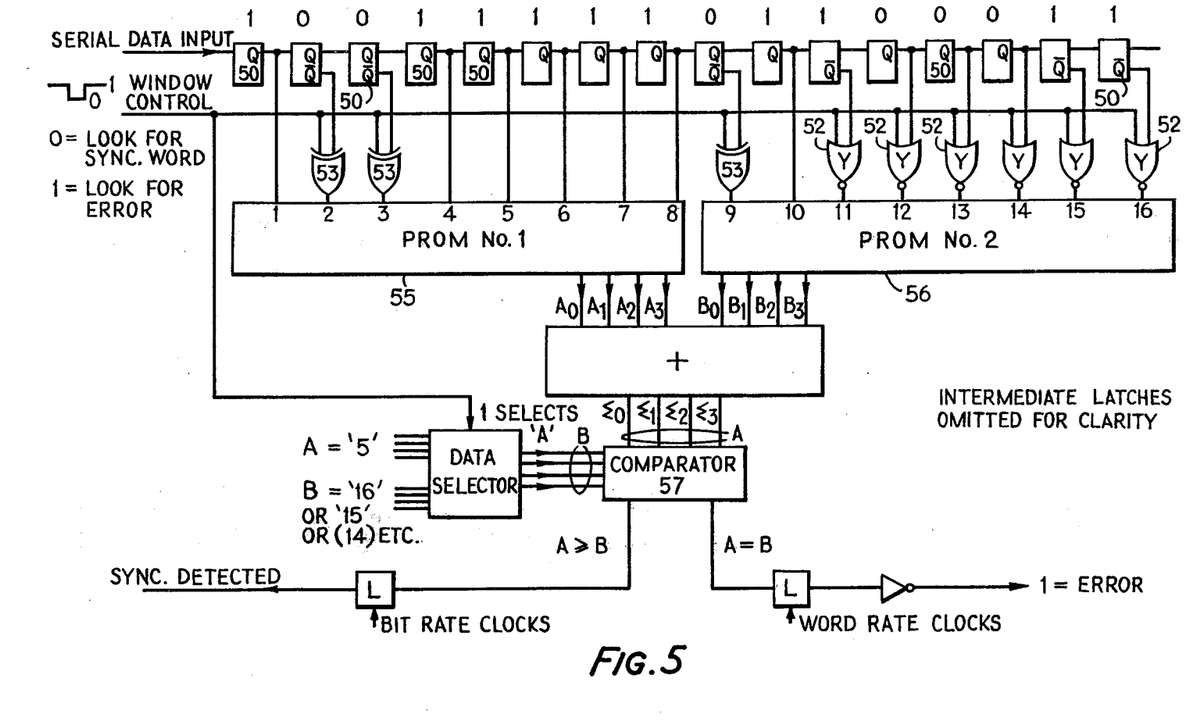
FIG. 5 shows apparatus for detecting errors or predetermined digital words.

Referring to FIG. 5, the apparatus is based on the start word detector disclosed in the aforementioned co-pending Applications Ser. No. 864,007 of Dec. 23, 1977, and Ser. No. 864,010 of Dec. 23, 1977 (continuation application filed Aug. 20, 1979) and is modified to detect both the start word as well as errors in the information carrying words. As a start word detector the apparatus is looking for a particular 16-bit word and the flip flops 50 and gates 52,53 are arranged such that when the start word is detected the inputs to the two programmable read only memories 55,56 will be all 'ones'. The outputs from the two memories 55,56 are combined and compared in a comparator 57 with a reference signal which determines the minimum number of 'ones' which are acceptable for a start word to be detected as correct. In general operation thus far the apparatus is similar to that disclosed in Applications Ser. No. 864,007 of Dec. 23, 1977 and Ser. No. 864,010 of Dec. 23, 1977 (continuation application filed Aug. 20, 1979) and attention is directed to that specification for further details.

As an error detector, only ten flip-flops are required since each data word is a 10-bit word, therefore the last six flip-flops are inhibited by providing a signal to the NAND gates 52. The error detection is based on the fact that each code or data word contains five 'ones' and five 'zeros'. The circuit therefore counts the number of 'ones' which are present in each word. It is necessary to alter the inputs to the memories 55,56 so that they will respond to each data word and not just to a particular word as previously. Therefore, a signal is fed to one input of the exclusive-OR gates 53. The memories now act as counters of the number of 'ones' which appear in each word and this is compared with a reference which in this case represents five so if there are five ones present the word is correct, if not an error signal is generated.

In the above description, the code used provides only 252 suitable words. In the present description inputs 253 and 255 are treated in the same way as 254 and inputs 0 and 2 treated in the same way as input 1 in the memories. Other levels could be introduced if necessary by using 4 other words with good clock components and slight DC imbalance e.g. 6 ones and 4 zeros or vice versa. Further, level shifting on detection of the sync period can be used which entails moving the whole range of 252 suitable words up and down.

Using the above code and a recording at 8.867 M words/sec, frequencies below 8 MHZ are attenuated, there being very little information below 4.433 MHZ.

We claim:

1. In a digital processing system including analog to digital converting means for converting an analog signal into digital signals in the form of words each consisting of a plurality of binary digits, and encoding means for encoding the digital signals by transforming the same into encoded digital words each having a predetermined number of identical binary digits;

the improvement which comprises (a) control means for controlling said encoding means, said control means being connected with said converting means for receiving a predetermined digit of the digital signals;

(b) said encoding means further including store means connected with said converting means for storing codes for encoding each of the digital signals; and (c) gating means for addressing said store means, said gating means having input terminals connected with said converting means for receiving the digital signals, output terminals connected with said store means, and a control terminal connected with said control means, said gating means being operable in accordance with a change in the output of said control means between a first condition in which the binary digits at the inputs of the gating means are passed unaltered, and a second condition complementing the binary digits at the inputs of said gating means, whereby said store means need contain codes for only one-half of the different digital signals available from said converting means.

2. Digital processing apparatus according to claim 1, wherein said control means includes an inverter, and further wherein said gating means includes a plurality of exclusive-OR gates.

3. Digital processing apparatus according to claim 1, wherein said store means includes at least one read only memory.

4. Digital processing apparatus according to claim 1, wherein said encoding means produces an encoded digital word having a greater number of digits than the number of digits at said gating means.

5. Digital processing apparatus according to claim 1, and further including parity generator means having inputs connected to outputs from said encoding means for determining whether there are an odd or even number of a predetermined binary digit, said parity generator means producing a further one of said predetermined binary digits when it detects an even number.

6. Digital processing apparatus according to claim 5, and further including additional control means responsive to the most significant digit of the digital signals, and a gating device having two inputs one of which is connected to an output from said further control means, and the other of which is connected to an output from said parity generator.

7. Digital processing apparatus according to claim 1, and further including means for presenting the digital signals to the encoding means in a parallel configuration, and converting means for performing a parallel to series conversion at the output from the encoding means.

8. Digital processing apparatus according to claim 7, and further including recording means connected to said converting means for recording the serial digits on a recording medium.

9. Digital processing apparatus according to claim 7, and further including transmitting means connected to said converting means for transmitting the serial digits.

10. A digital processing apparatus according to claim 1, and further including digital decoding apparatus including series to parallel converting means for decoding the digital words having a predetermined number of identical binary digits into digital words representing a plurality of different analogue levels.

11. A system according to claim 10, and further including error detection means for detecting errors in the encoded words received by said decoding means.

12. A system according to claim 11, wherein said error detector means includes means for counting the number of identical binary digits in an encoded word.

13. Apparatus as defined in claim 1, wherein said predetermined digit is the most significant digit.

14. Apparatus as defined in claim 13, wherein said store means is operable to store codes for encoding each of the digital signals less the most significant digit, said gating means being operable to receive the digital signals less the most significant digit of each word.

* * * * *